(12) United States Patent
Marinis et al.

(10) Patent No.: US 6,261,866 B1
(45) Date of Patent: Jul. 17, 2001

(54) METHOD AND APPARATUS FOR SEALING A CHIP CARRIER AND LID

(75) Inventors: Thomas F. Marinis, Haverhill; Cathy McEleney, Medford; Gregory M. Romano, Tewksbury, all of MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 09/364,965

(22) Filed: Jul. 30, 1999

(51) Int. Cl.[7] ............... H01L 21/44; H01L 21/48; H01L 21/50

(52) U.S. Cl. ............ 438/115; 438/118; 438/121; 438/125

(58) Field of Search .................. 438/115, 127, 438/118, 121, 125; 425/502; 34/242, 402

(56) References Cited

U.S. PATENT DOCUMENTS 4,382,327 * 5/1983 Bardens ................................. 29/588
5,688,708 * 11/1997 Kato ....................................... 437/51

FOREIGN PATENT DOCUMENTS

0472866 A2 * 3/1992 (DE) ................... H01L/21/324

* cited by examiner

Primary Examiner—Charles Bowers
Assistant Examiner—Nema Berezny
(74) Attorney, Agent, or Firm—Iandiorio & Teska

(57) ABSTRACT

A chip carrier and lid are sealed by mounting the chip carrier in an inverted position and mounting a lid having a sealing preform in an inverted position beneath and facing the chip carrier. The chip carrier and lid are then heated to melt the sealing preform and the chip carrier and lid are moved together to join them at the sealing preform.

5 Claims, 4 Drawing Sheets

METHOD AND APPARATUS FOR SEALING A CHIP CARRIER AND LID

FIELD OF INVENTION

This invention relates to a method of sealing a chip carrier and lid and an apparatus for holding, heating and joining them.

BACKGROUND OF INVENTION

Micro-mechanical gyroscopes and accelerometers must be sealed in a vacuum or inert atmosphere to operate. Two methods of vacuum sealing sensors are in use. In one method a lid with a small hole in it is welded on a chip carrier after a sensor is mounted inside. The chip carrier is then placed in a vacuum chamber and heated for several hours to drive out moisture and activate a getter element. Sealing is accomplished by dropping an indium ball on the lid, which melts and plugs the small hole as the chip carrier cools under vacuum. In the second method, oversized lids and chip carriers are placed in compartments of graphite trays. The lid tray is suspended above the chip carrier tray in a vacuum chamber and heated by passing an electric current through it. At the end of the degas time, the chip carrier tray is raised. Holes in the bottom of the lid tray allow the chip carriers to contact the lids. When this occurs, a braze preform on the chip carrier melts and seals the lid to the chip carrier. These methods of sealing require significant touch labor and processing time. They also yield packages that are less than sufficiently robust for military applications. The indium ball seal can soften and leak at temperatures above 125° C., while the oversize lid flexes and cracks its braze seal when subjected to high acceleration, e.g., a gun launch. The chip carrier with the weldable seal ring that is used in the indium ball process is expensive. In addition, in both approaches the sealing preform is added to the chip carrier after the chip is bonded into the carrier so that the chip can be damaged or contaminated during that process.

BRIEF SUMMARY OF THE INVENTION

It is therefore an object of this invention to provide an improved method of sealing a chip carrier and lid and an apparatus for holding, heating and joining them.

It is a further object of this invention to provide an improved method of sealing a chip carrier and lid and an apparatus for holding, heating and joining them which requires less touch labor and processing time and is less expensive.

It is a further object of this invention to provide an improved method of sealing a chip carrier and lid and an apparatus for holding, heating and joining them which yields a more robust product.

It is a further object of this invention to provide an improved method of sealing a chip carrier and lid and an apparatus for holding, heating and joining them which is better sealed, less likely to leak and can withstand higher acceleration force.

It is a further object of this invention to provide an improved method of sealing a chip carrier and lid and an apparatus for holding, heating and joining them which avoids the risk of contamination and damage attendant on applying the sealing preform to the carrier after the chip is bonded in place.

The invention results from the realization that a truly simple, yet effective sealing of a chip carrier and lid can be achieved by mounting the chip carrier in an inverted position with the lid mounted inverted, below and facing the chip carrier, then heating them and bringing them together to join them at the sealing preform carried by the lid.

This invention features a method of sealing a chip carrier and lid including mounting a chip carrier in an inverted position and mounting a lid having a sealing preform in an inverted position beneath and facing the chip carrier. The chip carrier and lid are heated to melt the sealing preform and the chip carrier and lid are moved together to join them at the sealing preform In a preferred embodiment there may be an evacuating space around the lid and carrier, the chip carrier may be heated to degas it, and the lid may include a getter. The method further includes heating the getter to activate it to evacuate the chip carrier. The moving of the chip carrier and lid together may include lifting the lid out of its mounting into contact with the carrier.

This invention also features a chip carrier and lid sealing apparatus including an upper holder for mounting at least one chip carrier in an inverted position and an upper heater for heating the chip carrier. A lower holder mounts at least one chip carrier lid with a sealing preform in an inverted position facing the chip carrier and a lower heater heats the lid and sealing preform. A drive mechanism moves the upper and lower holders together to join the carrier and lid with the sealing preform.

In a preferred embodiment the upper holder may include a cavity for receiving the chip carrier and a retainer for securing the chip carrier in the cavity. The retainer may include a keeper block and a spring for urging the keeper block against the chip carrier to secure it in its cavity. The lower holder may include a cavity for receiving the chip carrier lid. There may be a degas heat source for heating the chip carrier to degas it. The drive mechanism may include a drive device for moving at least one of the holders toward the other. The drive device may move the upper holder toward the lower holder. The drive mechanism may include a lifter device for lifting the lid out of the cavity to meet the chip carrier.

BRIEF DESCRIPTION OF THE DRAWINGS

Other objects, features and advantages will occur to those skilled in the art from the following description of a preferred embodiment and the accompanying drawings, in which.

Figure 1:
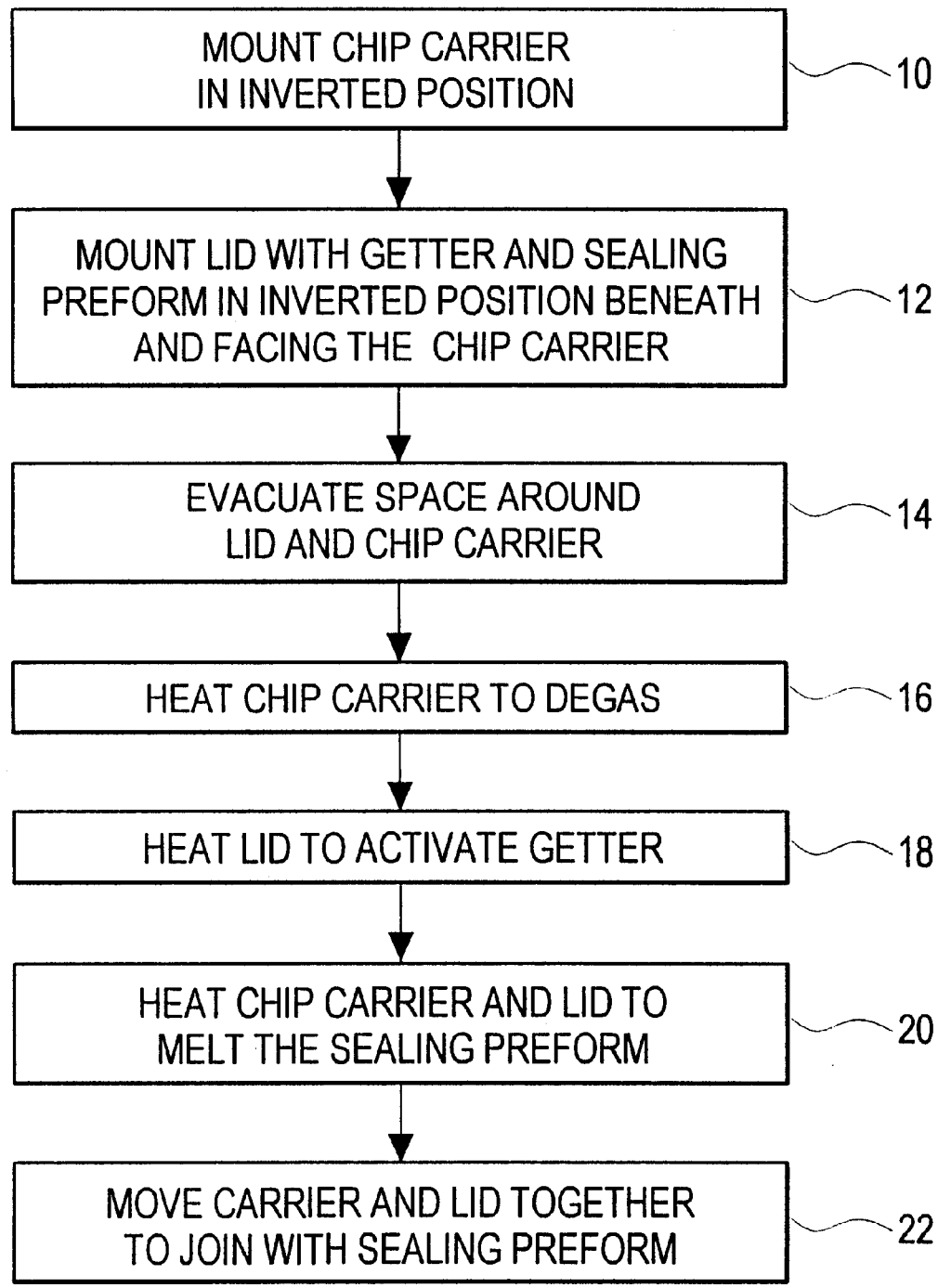
FIG. 1 is a flow chart of a method of sealing a chip carrier and lid according to this invention.

There is shown in FIG. 1 one embodiment of the method according to this invention which obtains the benefits and advantages of this invention independent of the particular apparatus used to carry it out. A chip carrier is mounted in an inverted position 10 and then a lid with a getter and sealing preform is mounted in an inverted position beneath and facing the chip carrier 12. The space around the lid and chip carrier are evacuated 14. The chip carrier is then heated to degas it 16. The lid is then heated to activate the getter 18 and the chip carrier and lid are then heated to melt the sealing preform 20 and the carrier and lid are moved together to be joined at the sealing preform 22. The getter material may be any suitable material such as SAES ST 122 which can be activated at a temperature of 400° C. for fifteen minutes or 350° C. for 360 minutes, or the getter material may be SAES 707 activated at a temperature of 500° C. for fifteen minutes or 400° C. for 360 minutes. The brazed material may be, for example, a brazing material such as gold-tin which functions at 260° C., tin-silver at 240° C., or gold germanium at 320° C.

Figure 2:
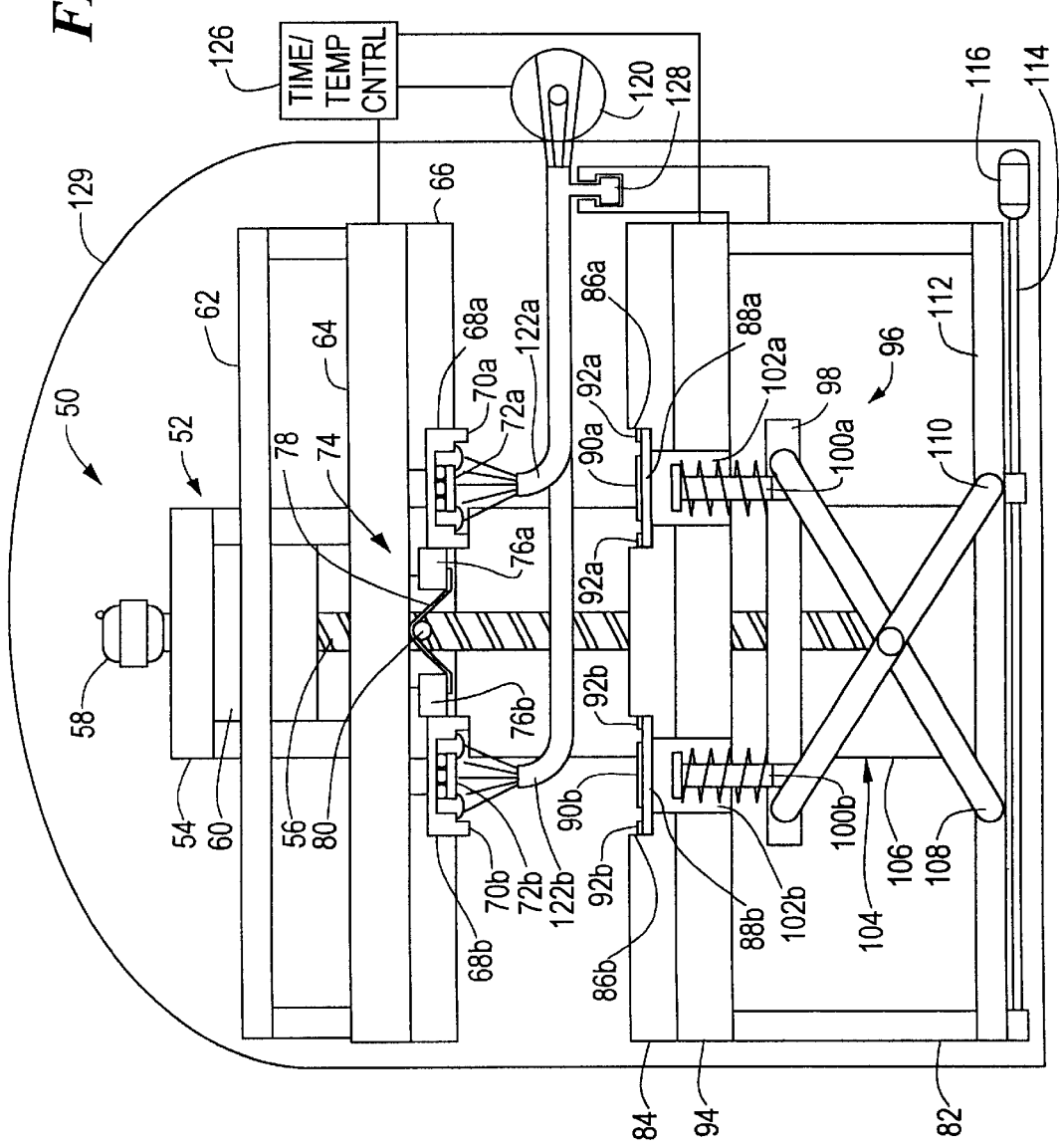
FIG. 2 is a diagrammatic front elevational view with portions in section of a chip carrier and lid apparatus in the open position according to this invention.
Figure 3:
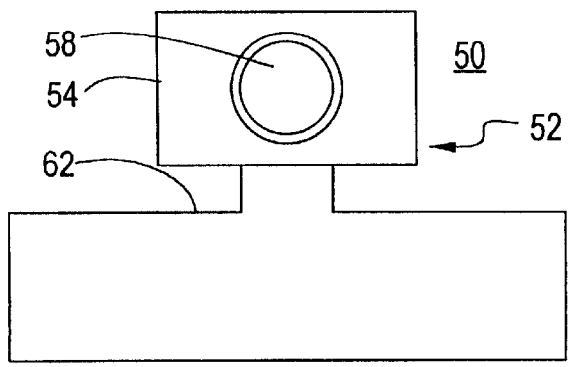
FIG. 3 is a top plan view of the apparatus of FIG. 2.

An apparatus according to this invention for carrying out the method includes a chip carrier and lid sealing system 50, FIGS. 2 and 3. There is a ball slide 52 including housing 54 which contains a lead screw 56 driven by motor 58 to move carriage block 60 up and down in housing 54. Mounted for movement with carriage block 60 is upper support frame 62 which contains upper heater 64 that may be a stainless steel table with one or more cartridge heaters. A tray 66, also typically made of stainless steel, is mounted in inverted position against heater 64. Tray 66 has one or more cavities 68a, 68b which receive chip carriers 70a, 70b which contain the chips 72a, 72b that are wire-bonded to and form a part of the chip carriers. A retainer 74, shown in more detail in FIGS. 5 and 6, includes retainer 74 including one or more retainer blocks 76a, 76b which are urged outwardly by spring 78 to urge carriers 70a and 70b against the walls of their cavities 68a and 68b and secure them in position. A retaining pin 80 holds pin 78 in position. Lower support frame 82 includes stainless steel tray 84 which includes one or more cavities 86a, 86b for holding lids each of which includes a getter 90a, 90b and a sealing preform 92a, 92b. A lower heater table 94 provides the heat to heat getters 90a, 90b and sealing preforms 92a, 92b. In this embodiment lower support frame 82 is fixed and as previously indicated upper support frame 62 moves. Alternatively, the converse could be true or both could move. System 50 may be included in bell jar 129 in order to provide a vacuum in the space around lids 88 and chip carriers 70.

A lifter mechanism 96 includes a jack plate 98 which carries one or more lifter pins 100a, 100b which when jack plate 98 rises, moves through holes 102a, 102b to lift lids 88a, 88b out of their respective cavities 86a, 86b so that at least the sealing preforms 92a, 92b clear the top of tray 84. Thus upon heating sealing preforms 92a and b will not inadvertently join to the tray 84 while they are attempted to be brazed to their respective chip carriers 70a and b. Jack plate 98 is driven up and down by means of a conventional scissor mechanism 104 with a center pivot 106 and one end fixed at 108 while the other end 110 is mounted to carriage block 112 which is driven to move left and right on lead screw 114 driven by motor 116. As can be understood when carriage block 112 moves to the left scissor 104 rises and lifts jack 98 and jack pins 100a and b, and the converse is true when carriage block 112 moves to the right. An additional heater in the form of an infrared source 120 may be employed using fiber optic elements 122a and 122b to apply further heat to chip carriers 70a and b in order to degas them. The temperature of the heaters and the time for which the heat is applied is as explained previously with respect to FIG. 1. A time and temperature control 126 is used to control the temperatures and the periods for which they are applied. In addition, a slide mechanism 128 driven by a motor not shown is used to move the heat source 120 and fiber optic elements 122a and 122b out of the way after degassing has been completed so that the upper and lower support frames 62, 82 and their trays 66 and 84 may be moved toward each other without interference.

Figure 4:
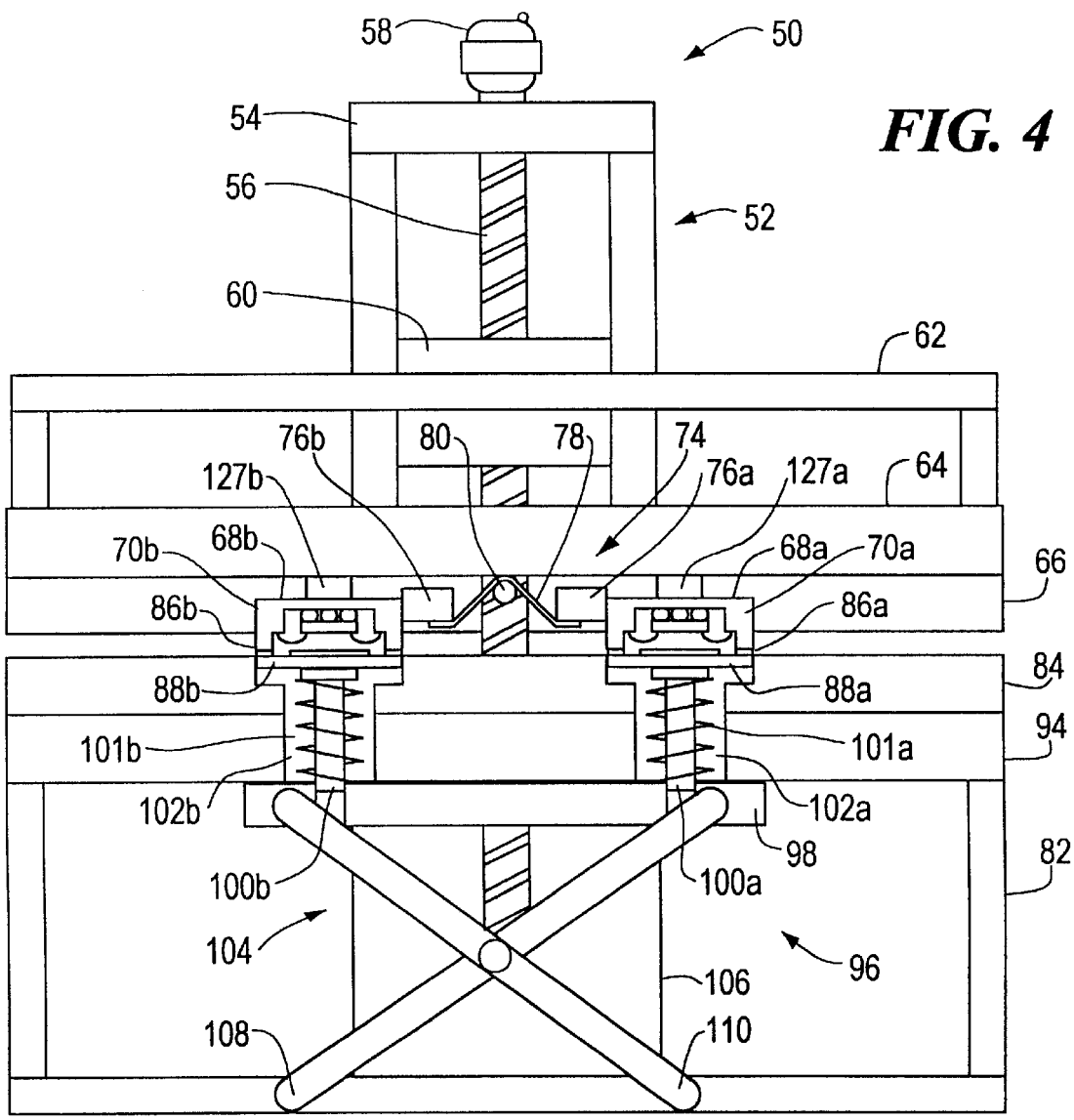
FIG. 4 is a view similar to FIG. 2 with the apparatus in the closed position.

The final stage where the upper tray 66 and lower tray 84 are brought together without touching is shown in FIG. 4, where it can be seen that at that point the jack pins 100a and b have raised lids 88a and b sufficiently so that their sealing preforms 86a and b clear the top of tray 84. Springs 101a, 101b provide for constant compliance against lids 88 which are quite thin, typically in the range of twenty thousandths of an inch thick, in order to minimize their mass and the effect on them of elevated accelerations. Preliminary data indicates that the final product is able to withstand accelerations of 40,000 to even 100,000 gs. Holes 127a and b are provided to allow chip carriers 70a and b to be popped out should they become lodged in their respective cavities 68a and b.

Figure 5:
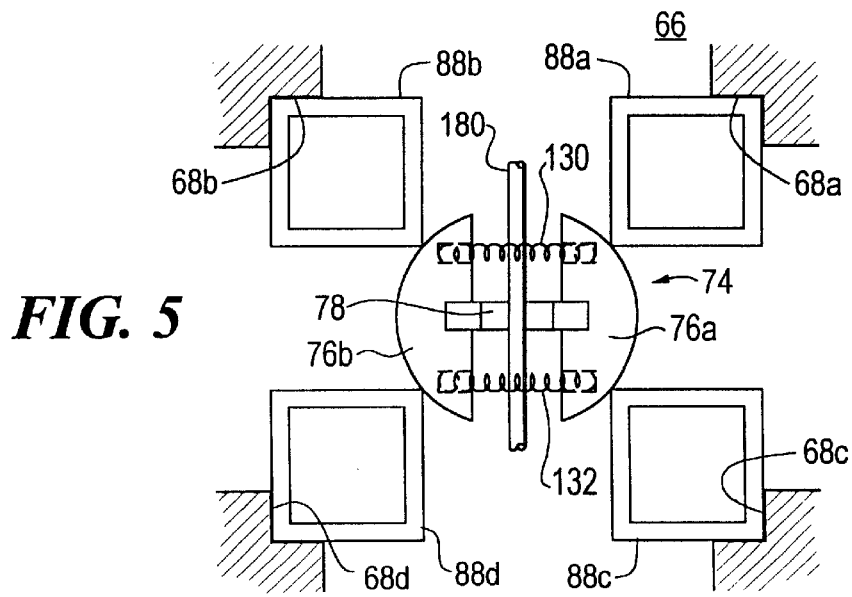
FIG. 5 is a diagrammatic plan view of a portion of the chip carrying tray in FIGS. 2 and 4 with a retainer according to this invention.
Figure 6:
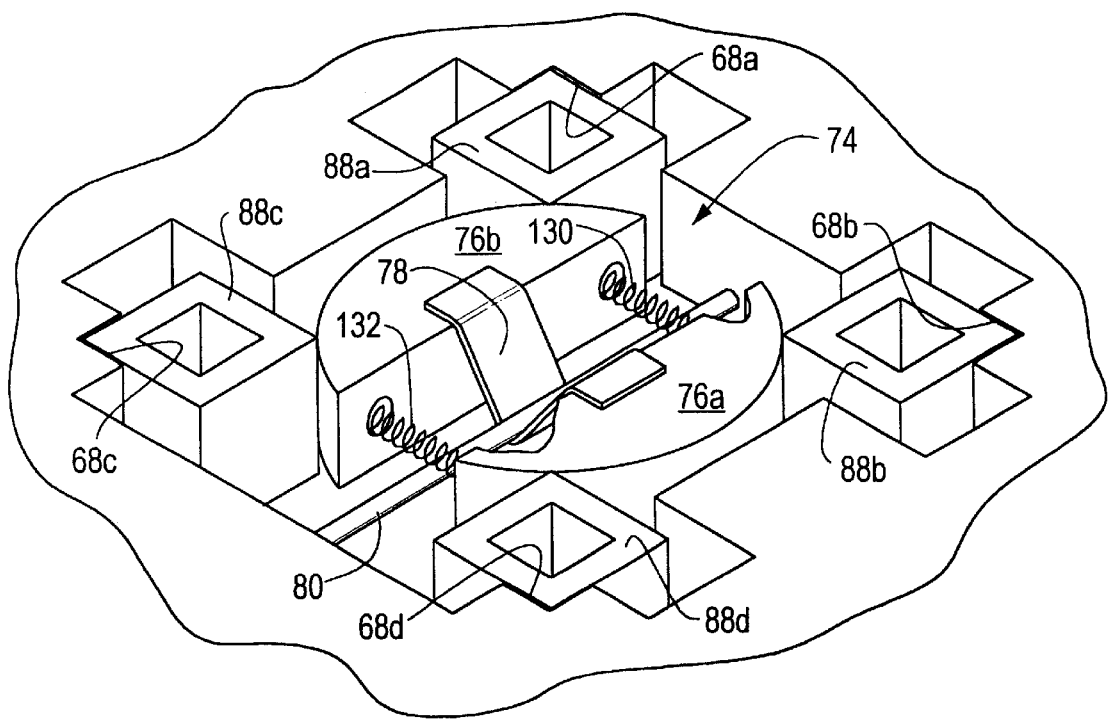
FIG. 6 is a diagrammatic three-dimensional view of the retainer and chip carriers in the recesses of the tray as shown in FIG. 5.

One construction of the retainer mechanism 74 which may be used to hold four chip carriers 88a–d in place upside down in tray 66 is shown in FIGS. 5 and 6, where it can be seen that retainer mechanism 74 includes a pair of hemispherical blocks 76a and b that are urged apart by spring 78 which is secured from falling out by means of pin 80. The force of spring 78 on blocks 76a and b causes them to provide a force against the respective corners of chip carriers 88a–d which drives them into the reference edges of cavities 68a–d. One or more springs 130, 132 may be used to keep blocks 76a and b from coming apart when there are no chip carriers 88a–d in place.

Although specific features of the invention are shown in some drawings and not in others, this is for convenience only as each feature may be combined with any or all of the other features in accordance with the invention.

Other embodiments will occur to those skilled in the art and are within the following claims:

What is claimed is:

1. A method of sealing a chip carrier and lid comprising:
   mounting a chip carrier in an inverted position;
   mounting a lid having a sealing preform in an inverted position beneath and facing the chip carrier;
   heating the chip carrier and lid to melt the sealing preform; and
   moving the chip carrier and lid together to join them at the sealing preform.

2. The method of claim 1 further including evacuating the space around the lid and carrier.

3. The method of claim 1 further including heating the chip carrier to degas it.

4. The method of claim 1 in which the lid includes a getter and the method further includes heating the getter to activate it to evacuate the chip carrier.

5. The method of sealing a chip carrier lid of claim 1 in which moving the chip carrier and lid together includes lifting the lid out of its mounting into contact with the carrier.

* * * * *